US007485476B2

(12) United States Patent
Laikhtman et al.

(10) Patent No.: US 7,485,476 B2
(45) Date of Patent: Feb. 3, 2009

(54) TERAHERTZ RADIATING DEVICE BASED ON SEMICONDUCTOR COUPLED QUANTUM WELLS

(75) Inventors: Boris Laikhtman, Jerusalem (IL); Leonid Shvartsman, Jerusalem (IL)

(73) Assignee: Yissum Research Development Company of the Hebrew University of Jerusalem, Jerusalem (IL)

( * ) Notice: Subject to any disclaimer, the term of this patent is extended or adjusted under 35 U.S.C. 154(b) by 369 days.

(21) Appl. No.: 11/488,186

(22) Filed: Jul. 18, 2006

(65) Prior Publication Data

US 2007/0054427 A1    Mar. 8, 2007

Related U.S. Application Data

(63) Continuation-in-part of application No. 10/743,268, filed on Dec. 23, 2003, now Pat. No. 7,176,498.

(60) Provisional application No. 60/492,728, filed on Aug. 6, 2003.

(51) Int. Cl.
*H01L 21/00* (2006.01)

(52) U.S. Cl. .............................. 438/22; 438/45; 438/46; 438/47; 257/E33.008

(58) Field of Classification Search ................... 438/22, 438/45, 46, 47; 257/E33.008, E33.023, E33.048
See application file for complete search history.

(56) References Cited

U.S. PATENT DOCUMENTS

| | | | |
|---|---|---|---|
| 4,348,686 | A | 9/1982 | Esaki et al. |
| 4,371,884 | A | 2/1983 | Esaki et al. |
| 4,558,336 | A | 12/1985 | Chang et al. |
| 4,745,452 | A | 5/1988 | Sollner |
| 4,806,993 | A | 2/1989 | Voisin et al. |
| 5,113,231 | A | 5/1992 | Soderstrom et al. |
| 5,185,647 | A | 2/1993 | Vasquez |
| 5,194,983 | A | 3/1993 | Voisin |

(Continued)

FOREIGN PATENT DOCUMENTS

EP    0 433 542 A2    6/1991

(Continued)

*Primary Examiner*—Wai-Sing Louie
(74) *Attorney, Agent, or Firm*—Browdy and Neimark, P.L.L.C.

(57) ABSTRACT

A method is presented for fabricating a semiconductor device operable to generate a THz spectral range radiation in response to an external field. According to this method, a heterostructure is formed from selected layers. The layers include at least first and second semiconductor layers made of materials having a certain initial overlap between the valence band of the second layer material and the conduction band of the first layer material. The heterostructure layers are arranged with a selected layout providing a quantum mechanical coupling between an electron quantum well (EQW) in said first layer and a hole quantum well (HQW) in said second layer. The layout is selected so as to define a predetermined arrangement of a plurality of energy subbands and a predetermined dispersion of these subbands to define a desired effective overlap between the energy subbands of said conduction and valence bands. This enables the device operation for generation of the THz spectral range radiation originating from multiple radiative transitions of non-equilibrium carriers including at least one transition from transitions between the following: energy subbands of the EQW, energy subbands of the HQW, and ground energy electron subband of the EQW and ground energy hole subband of the HQW.

41 Claims, 8 Drawing Sheets

U.S. PATENT DOCUMENTS

| | | |
|---|---|---|
| 5,588,015 A | 12/1996 | Yang |
| 5,710,430 A | 1/1998 | Nuss |
| 5,894,125 A | 4/1999 | Brener et al. |
| 6,037,604 A | 3/2000 | Su et al. |
| 6,316,771 B1 | 11/2001 | Jurisson et al. |
| 6,476,411 B1 * | 11/2002 | Ohno et al. .................. 257/15 |
| 6,618,413 B2 | 9/2003 | Bour et al. |
| 6,635,907 B1 | 10/2003 | Nguyen et al. |
| 2003/0127673 A1 | 7/2003 | Williamson et al. |
| 2004/0061102 A1 * | 4/2004 | Tansu et al. .................. 257/13 |
| 2005/0029508 A1 | 2/2005 | Laikhtman et al. |

FOREIGN PATENT DOCUMENTS

| | | |
|---|---|---|
| JP | 04-042983 A | 2/1992 |
| WO | WO 98/40916 A1 | 9/1998 |

* cited by examiner

US 7,485,476 B2

TERAHERTZ RADIATING DEVICE BASED ON SEMICONDUCTOR COUPLED QUANTUM WELLS

FIELD OF THE INVENTION

The present invention relates generally to terahertz radiating semiconductor devices, and more particularly to a quantum well oscillator operating in a terahertz region.

BACKGROUND OF THE INVENTION

A terahertz region of the spectrum of electromagnetic radiation (T-Rays or THz) is located between the most long wavelength "optical" part of the spectrum, i.e. the infra-red light, and the most short wavelength part of the "radio" spectrum, known as microwaves. The terahertz spectral region thus encompasses the frequencies in the range of about 0.1 through 20 THz or the wavelengths in the range of about 15 μm through 3 mm, although it should be appreciated that these limits are indicative rather than absolute.

The terahertz spectral range has an extreme importance owing to the variety of applications where it can be utilized. One important application of the terahertz spectral range is related to various imaging techniques (medical imaging, technological imaging, or security imaging), where there is a trend for a switch from the harmful and, sometimes, lethal X-rays to T-rays (see, for example, U.S. Pat. Nos. 5,710,430 to Nuss and U.S. Pat. No. 5,894,125 to Brener et al.)

Terahertz radiation can penetrate non-polar substances such as fats, cardboard, cloth and plastics with little attenuation. On the other hand, materials including organic substances have varying responses (transmission, reflection and absorption characteristics) to terahertz radiation. Likewise, water molecules absorb terahertz waves, on the one hand limiting penetration of the radiation in moist substances, and on the other hand making it readily detectable even in very low concentrations. Accordingly, use of terahertz radiation can indicate the presence of different materials in a medium.

T-rays are strongly attenuated by moist tissue, because of water absorption. However, having low average power, i.e. relatively low ionizing capability, T-rays are particularly attractive for medical applications where it is important to avoid damaging a biological sample.

Another important application of terahertz radiation is related to the communication technology. This can be the terahertz range that is the nearest and the most important barrier in the way to increase the bandwidth of wavelength-division-multiplexed communication networks.

Recent achievements in both fields mentioned above are rather remarkable, but still limited. The key reason for this limitation is a lack of reliable THz sources and detectors, especially when compared with the neighboring frequency ranges of microwaves and infrared radiation.

U.S. Pat. No. 6,476,411 to Ohno et al. describes a luminescent element that consists of indium-arsenide (InAs) and gallium-antimony (GaSb) semiconductor layers formed with specified band gap. The first layer makes a heterojunction with the second layer. The top of the valence band of the first semiconductor material is higher in energy than the bottom of the conduction band of the second semiconductor material. The element further includes a third layer making a heterojunction with the first or second layer. The third layer has a superlattice structure. One of the first and second layers is provided on the semiconductor substrate directly or through at least one semiconductor layer.

U.S. Pat. Application No. 2003/0127673 to Williamson et al. describes a semiconductor epitaxial structure optimized for photoconductive free space terahertz generation and detection. The epitaxial structure, termed as a photoconductive gate, includes a substrate composed of GaAs. A barrier layer is disposed between the substrate and photoconductive layer. A bipolar terahertz antenna comprised of a first pole and a second pole is disposed on the photoconductive layer. Sampling of a free space terahertz waveform occurs when the illuminated photoconductive gate conducts for a time shorter than the entire terahertz wave cycle. During the conduction period, charge flows from one side to another of a dipole antenna structure due to the potential difference induced by the terahertz wave. The amount of current flow per sampling optical pulse is proportional to the terahertz voltage potential and the off-state resistance of the interaction area.

SUMMARY OF THE INVENTION

There is a need in the art for, and it would be useful to have, a novel semiconductor device and method of its fabrication to enable the device operation in THz spectral range and having improved gain characteristics.

The present invention provides a semiconductor device and method for generating radiation of a THz spectral range. The semiconductor device comprises a heterostructure that includes two or more semiconductor layers. The first and second semiconductor layers are made of materials providing a quantum mechanical coupling between an electron quantum well (EQW) in the first layer and a hole quantum well (HQW) in the second layer. The materials are such that an overlap is provided between the valence band of the material of the second layer and the conduction band of the material of the first layer. Preferably, the first layer material is InAs-based and the second layer material is GaSb-based.

The inventor has found that the device operation can be significantly improved by adjusting, in a controllable way, an effective overlap between the conduction and valence bands of the first and second layers' materials, respectively, such that an energy gap between these bands lies in a THz spectral range. The "effective overlap" is defined by the dispersion of energy subbands in the conduction band of the first layer and the valence band of the second layer. For given materials of the first and second semiconductor layers that define a certain overlap between the conduction and valence bands therein (e.g., 150 meV for the first and second layers made of pure InAs and GaSb), the desired effective overlap may be reduced in a controllable way or cancelled completely by appropriately varying the heterostructure parameter(s).

Thus, the main idea of the present invention consists of selecting a layout of the layers of the heterostructure so as to provide a predetermined dispersion of energy subbands in the conduction band of the first layer and the valence band of the second layer. An application of an external bias field across the first and second layers causes THz radiation originating from radiative transitions of non-equilibrium carriers between at least one of the following: interband transitions (i.e., between ground energy subbands of the EQW and HQW) and intersubband transitions (i.e., neighboring energy subbands of the EQW, neighboring energy subbands of the HQW).

The inventors have found that the interband radiative transition (i.e., radiative transition from the ground conductive subband of the first layer material (InAs-based material) and the ground valence band of the second layer material (GaSb-based material)) and a combination of interband and intersubband radiative transitions provide the major factor contributing to the THz radiation. Unique properties of InAs/GaSb heterostructures provide for using them in lasers and detectors with a number of advantages compared to the conventionally used GaAs-based devices. The most striking feature of InAs/GaSb heterostructures is the overlap of the conduction band of bulk InAs and the valence band of bulk GaSb. This feature allows for fabricating coupled InAs/GaSb coupled quantum wells with a variety of different spectra. The confinement of electrons and holes in such a structure is provided by embedding this coupled quantum well in between AlSb that has a very wide band gap and practically the same lattice constant. When the quantum confinement removes partially or completely this band overlap, the resulting may easily be tuned in the THz range. This allows for designing an interband THz laser. Such THz lasers are based on structures that combine both the interband and intersubband radiative transitions. Depending on whether the original overlap is removed completely or just partially, there are two possible kinds of band structure of InAs/GaSb based THz lasers: V-shape dispersion of carriers and W-shape dispersion of the carriers in ground states. V-dispersion band structure is formed when the initial overlap is completely removed by quantum confinement energies of both electron and holes, while the W-dispersion band structure is formed when this overlap is removed just partially so that the hybridization gap, lying in THz range, is formed.

The term "layout of the layers" used herein signifies the layers' arrangement (e.g., the optional use of a barrier layer between the first and second semiconductor layers and/or cladding layers enclosing the first and second layers therebetween) and the layers' parameters (geometry and materials).

The first and second layers may be directly coupled to each other, or may be coupled via a barrier layer. The heterostructure may comprise first and second cladding layers enclosing therebetween the first and second layers (with or without a barrier layer between them). For example for the InAs-based and GaSb-based first and second layers, the first and second cladding layers are preferably selected from AlInAs-based and AlSb-based materials, respectively. The barrier layer may be based on AlSb.

The device further includes an electrode arrangement configured for the application of the external bias field, e.g., electric voltage.

The device of the present invention may be configured as a resonator cavity. In such a case, the heterostructure operates as an active medium of the cavity.

As indicated above, the predetermined dispersion of the energy subbands in the quantum wells defines the effective overlap between the conduction and valence bands of the first and second layers' materials, respectively. This dispersion may be such that energy of the ground hole subband of the HQW without any coupling is either higher or lower than the energy of the ground electron subband of the EQW without any coupling.

The predetermined dispersion of the energy subbands can be controlled by altering the thickness and/or chemical compound of at least one of the layers (i.e., at least one of the first and second layers, and/or the barrier layer, and/or the cladding layers), and/or the width and predetermined potential profile of at least one of the quantum wells. The material composition of at least one of the first and second layers may be spatially inhomogeneous in a direction normal to the respective layer. In such a case, the predetermined potential profile of the respective quantum well can be provided.

The THz radiation provided by the semiconductor device of the invention can be enhanced by a resonance condition of the radiative transitions between the energy subbands. These radiative transitions include transitions between the neighboring subbands within the EQW and/or the neighboring subbands within the HQW. Moreover, the resonance condition can be further enhanced by the radiative transitions between the ground subband of the EQW and the ground subband of the HQW.

The predetermined dispersion of the subbands may be such that a plurality of the neighboring energy subbands in at least one of the EQW and HQW are substantially equidistant, thereby causing the resonance condition of the radiative transitions between the neighboring energy subbands of the respective quantum well. Preferably, the neighboring energy subbands of the EQW and HQW are all substantially equidistant within each quantum well, and a distance between the ground energy subbands of the EQW and HQW is equal to the distance between the neighboring energy subbands of the EQW and HQW.

The predetermined particular potential profile of at least one of the EQW and HQW may be substantially semi-parabolic. This provides substantial equidistance in between a plurality of the neighboring energy subbands in the respective quantum well for causing a resonance condition of the radiative transitions between the subbands.

The predetermined potential profile of at least one of the EQW and HQW may be substantially step-like, while a few of the neighboring energy subbands in the respective quantum well are substantially equidistant for causing a resonance condition of the radiative transitions between the subbands.

The semiconductor device of the present invention operable in a THz range has many of the advantages of the techniques mentioned theretofore, while simultaneously overcoming some of the disadvantages normally associated therewith.

For example, the semiconductor device according to the present invention can demonstrate the improved temperature characteristics owing to the parallelism of the equidistant subbands in the EQW. Such parallelism results in the fact that temperature broadening of the carrier energy distribution of each subband substantially does not influence on the gain.

Furthermore, the semiconductor device according to the present invention can demonstrate improved radiative characteristics, because the Auger recombination is suppressed owing to the rather effective nearly static screening of the Coulomb interaction contrary to the much less effective dynamic screening in the infrared and optical wavelength range. Likewise, the radiative characteristics can be improved because the optical phonon scattering can be suppressed when the radiated frequency is lower than the typical radiated frequency of optical phonons.

Moreover, the semiconductor device according to the present invention is of a durable and reliable construction, may be easily and efficiently manufactured and marketed, and may have low manufacturing cost.

Thus, in accordance with one broad aspect of the invention, there is provided a semiconductor device operable in a THz spectral range, the device comprising a heterostructure including at least first and second semiconductor layers, the first and second layers being made of materials providing a quantum mechanical coupling between an electron quantum well (EQW) in the first layer and a hole quantum well (HQW) in the second layer, and providing an overlap between the valence band of the material of the second layer and the conduction band of the material of the first layer, a layout of the layers being selected so as to provide a predetermined dispersion of energy subbands in the conduction band of the first layer and the valence band of the second layer to define a desired effective overlap between the energy subbands of said conduction and valence bands, whereby an application of an external bias field across the first and second layers causes THz radiation originating from radiative transitions of non-equilibrium carriers between at least one of the following: neighboring energy subbands of the EQW, neighboring energy subbands of the HQW, and ground energy subbands of the EQW and HQW.

According to another broad aspect of the invention, there is provided a semiconductor device operable in THz spectral range, the device comprising a heterostructure including at least first and second semiconductor layers made of InAs-based and GaSb-based materials, respectively, providing a quantum mechanical coupling between an electron quantum well (EQW) in the InAs-based layer and a hole quantum well (HQW) in the GaSb-based layer, and providing an overlap between the valence band of the GaSb-based material and the conduction band of the InAs-based material, a layout of the layers of the heterostructure being selected so as to provide a predetermined dispersion of energy subbands in the conduction band of the InAs-based layer and in the valence band of the GaSb-based layer to define a desired effective overlap between the energy subbands of said conduction and valence bands, whereby an application of an external bias field across said first and second layers causes the THz spectral range radiation originating from at least interband radiative transitions of non-equilibrium carriers between ground energy subbands of the EQW and HQW.

According to yet another broad aspect of the present invention there is provided a method of fabricating a semiconductor device operable in a THz spectral range, the method comprising forming a heterostructure from selected layers, wherein the layers include at least first and second semiconductor layers made of materials having a certain initial overlap between the valence band of the second layer material and the conduction band of the first layer material, the heterostructure layers being arranged with a selected layout providing a quantum mechanical coupling between an electron quantum well (EQW) in said first layer and a hole quantum well (HQW) in said second layer, the layout of the layers of the heterostructure is selected so as to define a predetermined arrangement of a plurality of energy subbands and a predetermined dispersion of these subbands to define a desired effective overlap between the energy subbands of said conduction and valence bands, thereby enabling the device operation for generation of the THz spectral range radiation originating from multiple radiative transitions of non-equilibrium carriers including at least one transition from transitions between the following: energy subbands of the EQW, energy subbands of the HQW, and ground energy electron subband of the EQW and ground energy hole subband of the HQW.

In case when at least several of the above-mentioned radiative transitions have substantially the same frequency, they are resonantly enhanced and favor the higher gain.

According to some embodiments of the invention, the predetermined dispersion of the energy subbands includes W-like dispersion of both the ground hole subband of the HQW and of the ground electron subband of the EQW.

According to some embodiments of the invention, the predetermined dispersion of the energy subbands includes parabolic-like dispersion of the ground hole subband of the HQW and of the ground electron subband of the EQW.

The said predetermined dispersion of the energy subbands may be provided by selecting at least one of the following parameters of the layout: thickness of at least one of the layers, chemical compound of the material of at least one of the layers, width and predetermined potential profile of at least one of the quantum wells.

The parameters may be include the thickness and chemical compound of the material of a barrier layer arranged between the first and second layers; or chemical compound of the material of cladding layers enclosing the first and second layers therebetween. The material composition of at least one of the first and second layers may be selected to be spatially inhomogeneous in a direction normal to the respective layer, thereby providing for a predetermined inhomogeneous potential profile of the respective quantum well.

Preferably, the layer layout is selected so as to create a resonance condition of the multiple resonant radiative transitions substantially of the same frequency of the THz spectral range between the substantially equidistant neighboring subbands.

The multiple radiative transitions may include a transition between the ground subband of the EQW and the ground subband of the HQW; and/or transitions between a few of the energy subbands of a quantum well selected from the EQW and HQW; and/or a transition between energy subbands of a quantum well selected from the EQW and HQW and a transition between the ground electron energy subband of the EQW and the ground hole subband of the HQW.

The predetermined inhomogeneous potential profile of at least one quantum well selected from the EQW and HQW may be selected to be substantially semi-parabolic, thereby providing for substantial equidistance in between a few of neighboring energy subbands including neighboring energy subbands in this quantum well and the neighboring ground electron subband of the EQW and ground hole subband of the HQW for causing the multiple radiative transitions substantially of the same frequency of the THz spectral range between the substantially equidistant neighboring subbands.

The predetermined potential profile of at least one quantum well selected from the EQW and HQW may be selected to be substantially step-like. This provides for substantial equidistance in between a few of neighboring energy subbands including neighboring energy subbands in said quantum well and the neighboring ground electron subbands of the EQW and ground hole subband of the HQW for causing the multiple radiative transitions substantially of the same frequency of the THz spectral range between the substantially equidistant neighboring subbands.

According to yet another broad aspect of the invention, there is provided a method of fabricating a semiconductor device operable to generate a THz spectral range radiation in response to an external field, the method comprising forming a heterostructure from selected layers, wherein the layers include at least first and second semiconductor layers made of materials having a certain initial overlap between the valence band of the second layer material and the conduction band of the first layer material, the heterostructure layers being arranged with a selected layout providing a quantum mechanical coupling between an electron quantum well (EQW) in said first layer and a hole quantum well (HQW) in said second layer, the layout of the layers of the heterostructure is selected so as to define a predetermined arrangement of a plurality of energy subbands and a predetermined dispersion of these subbands to define a desired effective overlap between the energy subbands of said conduction and valence bands, the heterostructure is being provided with electrode contacts for application of a bias field across the first and second layers thereby enabling the device operation for generation of the THz spectral range radiation originating from multiple radiative transitions of non-equilibrium carriers including at least one transition from transitions between the following: neighboring energy subbands of the EQW, neighboring energy subbands of the HQW, and ground energy electron subband of the EQW and ground energy hole subband of the HQW.

According to yet another aspect of the invention, there is provided a method of fabricating a semiconductor device operable to generate a THz spectral range radiation in response to an external field, the method comprising forming a heterostructure from selected layers, wherein the layers include at least first and second semiconductor layers made of materials having a certain initial overlap between the valence band of the second layer material and the conduction band of the first layer material, the heterostructure layers being arranged with a selected layout providing a quantum mechanical coupling between an electron quantum well (EQW) in said first layer and a hole quantum well (HQW) in said second layer and providing a predetermined potential profile in at least one of the quantum wells, defining an arrangement of a ground electron energy subband in the EQW and a hole energy subband in the HQW, thereby defining a desired effective overlap between the energy subbands of said conduction and valence bands thereby enabling the device operation for generation of the THz spectral range to originate from a radiative transition of non-equilibrium carriers between said ground subbands. There has thus been outlined, rather broadly, the more important features of the invention so that the detailed description thereof that follows hereinafter may be better understood. Additional details and advantages of the invention will be set forth in the detailed description, and in part will be appreciated from the description, or may be learned by practice of the invention.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF SPECIFIC EMBODIMENTS

Figure 1A:
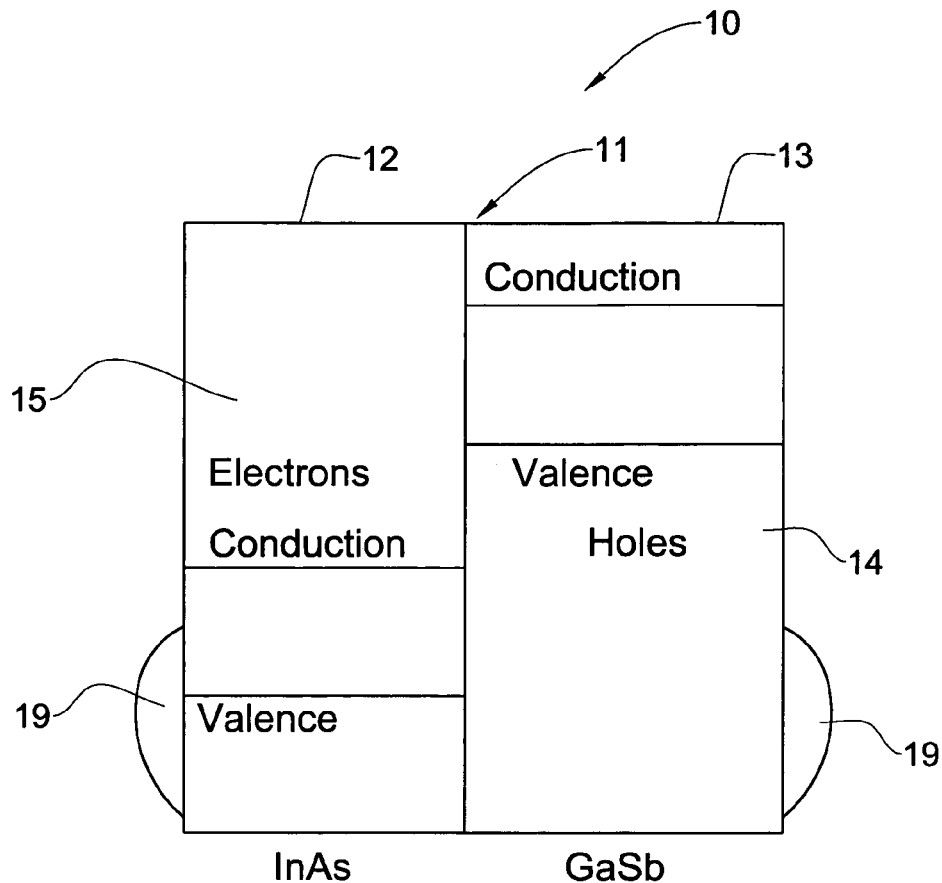
FIGS. 1A-1D illustrate enlarged cross-sectional views of semiconductor devices, according to several examples of the present invention.

The principles and operation of a device according to the present invention may be better understood with reference to the drawings and the accompanying description, it being understood that these drawings and examples in the description are given for illustrative purposes only and are not meant to be limiting. Dimensions of layers and regions may be exaggerated for clarity. The same reference numerals will be utilized for identifying those components which are common in all the examples of the invention.

Referring to FIG. 1A, there is illustrated a schematic cross-sectional view of an exemplary semiconductor device 10 operable in terahertz (THz) spectral range, according to the present invention. It should be noted that this figure is not to scale, and is not in proportion, for purposes of clarity. The device 10 may for example be a source (emitter) of THz radiation.

The semiconductor device 10 comprises a heterostructure 11 including a first semiconductor layer 12 and a second semiconductor layer 13. The first and second semiconductor layers are made of materials providing a quantum mechanical coupling between an electron quantum well (EQW) in the first layer 12 and a hole quantum well (HQW) in the second layer 13. The materials of the first and second layers are selected so as to provide an overlap between the valence band 14 of the second layer 13 and the conduction band 15 of the first layer 12. Preferably, the material of the first layer is InAs-based and the material of the second layer is GaSb-based. For instance, when the first and second layers are made of pure InAs and GaSb, respectively, the overlap between the valence band 14 of the second layer 13 and the conduction band 15 of the first layer 12 is about 150 meV.

As shown in the example of FIG. 1A, the first semiconductor layer 12 and the second semiconductor layer 13 are abutting one another. Thus, the direct quantum-mechanical coupling is provided, and in other words, the layers 12 and 13 are directly coupled to each other.

Figure 1B:
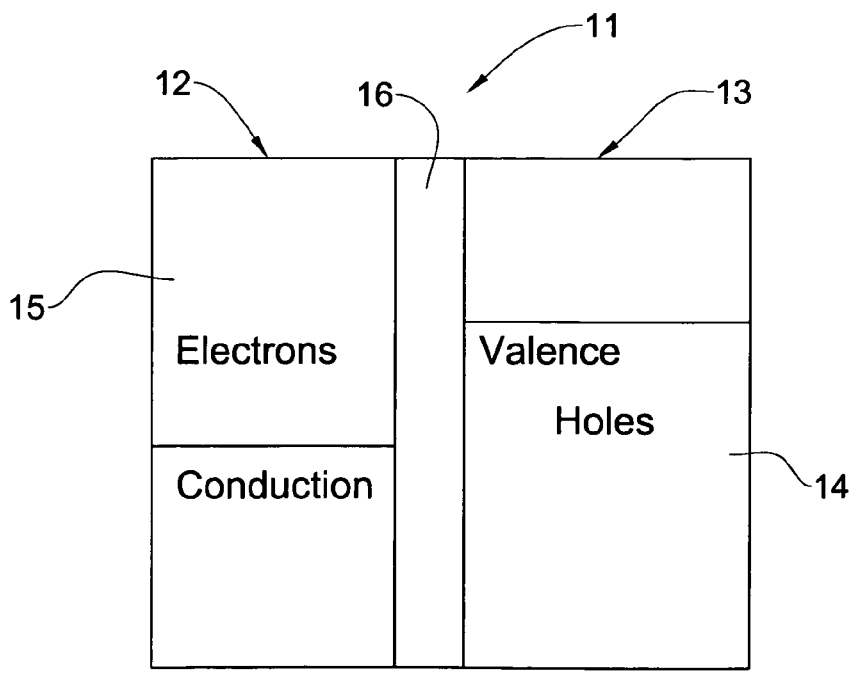
Figure 1C:
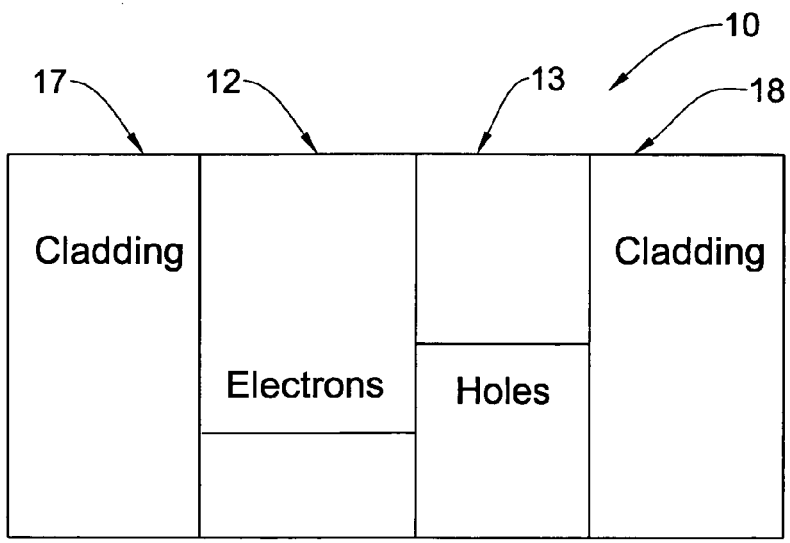
Figure 1D:
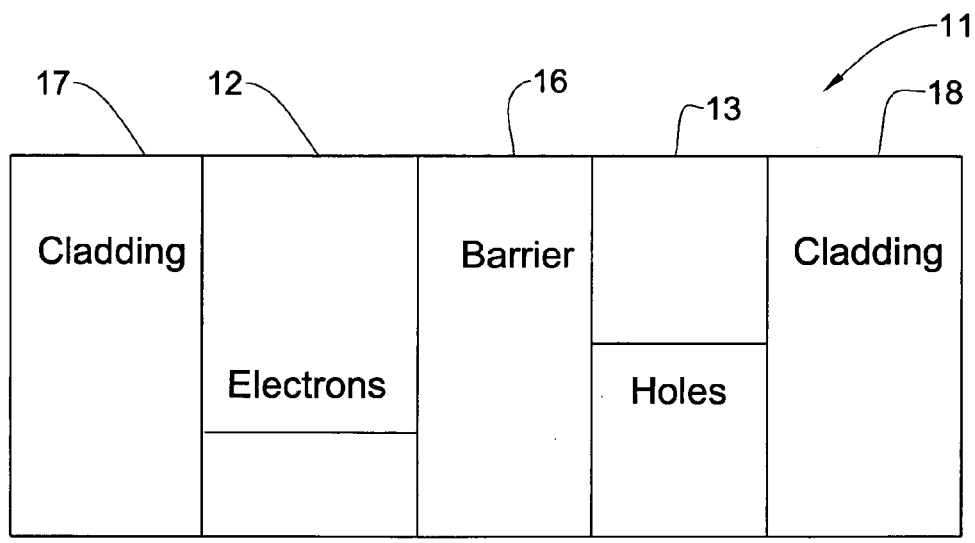

FIG. 1B-1D show three more examples, respectively, of the implementation of the device of the present invention. In the example of FIG. 1B, the first and second layers 12 and 13 are coupled to each other via a barrier layer 16. In the example of FIG. 1C the heterostructure 11 further comprises first and second cladding layers 17 and 18 enclosing the first and second layers 12 and 13 therebetween. As shown in FIG. 1D, the heterostructure 11 includes the barrier layer 16 between the first and second layers 12 and 13, and the first and second cladding layers 17 and 18 enclosing therebetween the first and second layers 12 and 13 with the barrier layer 16 between them.

The layers' layout in the heterostructure is selected so as to provide a predetermined dispersion of energy subbands in the conduction band of the first layer 12 and the valence band of the second layer 13. As indicated above, the term "layer's layout" used herein signifies the layers' arrangement (e.g., the use of a barrier layer and/or cladding layers) and their parameters (geometry and materials). The application of an external bias field across the first and second layers (via an electrodes' arrangement 19 shown in FIG. 1A) injecting electrons and holes in the first and second layers, respectively, causes THz radiation originating from radiative transitions of non-equilibrium carriers between at least one of the following: ground energy subbands of the EQW and HQW (interband transition) and/or neighboring energy subbands of the EQW and/or neighboring energy subbands of the HQW (intersubband transitions).

The layers' layout includes that of the first and second semiconductor layers 12 and 13, and possibly also the first and second cladding layers 17 and 18 and/or the barrier layer 16. The predetermined dispersion of the energy subbands provides an energy gap between the ground energy subbands in the EQW and HQW layers, which gap lies in the THz spectral range. The predetermined dispersion of the energy subbands may be such that the energy of the ground hole subband of the HQW without any coupling is higher than the energy of the ground electron subband of the EQW without any coupling. According to another embodiment of the invention, the predetermined dispersion of the energy subbands is such that the energy of the ground hole subband of the HQW without any coupling is lower than the energy of the ground electron subband of the EQW without any coupling.

Thus, the predetermined dispersion of the energy subbands can be controlled by altering various parameters of the heterostructure. For example, this can be achieved by altering thickness of at least one of the first and second layers 12 and 13. The widths of each of the first and second layers may be in a range of 1-500 nm. According to a further example, the predetermined dispersion of the energy subbands can be controlled by appropriately selecting a chemical compound of the material of at least one of the layers.

It should be appreciated that when the first and second layers 12 and 13 are coupled to each other via the barrier layer 16 (as exemplified in FIG. 1B), the parameters controlling the dispersion of the energy subbands may include the thickness and chemical compound of the material of the barrier layer. For example, the barrier layer can have a thickness in the range of 0.6-6 nm. A specific but not limited example of the barrier layer material is AlSb.

Likewise, when the semiconductor device of the invention comprises the first and second cladding layers 17 and 18 enclosing the first and second layers 12 and 13 (as exemplified in FIG. 1C), the parameters controlling the dispersion of the energy subbands may include the thickness and chemical compound of the material of the cladding layers. For example, the thickness of the first and second cladding layers 17 and 18 can be in the range of 0.1-100 nm. In turn, the cladding layers 17 and 18 can, for example, be selected from $Al_xIn_{(1-x)}As$-based and AlSb-based materials, respectively.

Alternatively or additionally, the predetermined dispersion of the energy subbands can be achieved by appropriately selecting the width and predetermined potential profile of at least one of the quantum wells. The predetermined potential profile of the quantum well can be controlled by altering a material composition of the respective one of the first and second layers, thereby providing a quantum well which is spatially inhomogeneous in a direction normal to the respective layer.

Figure 2:
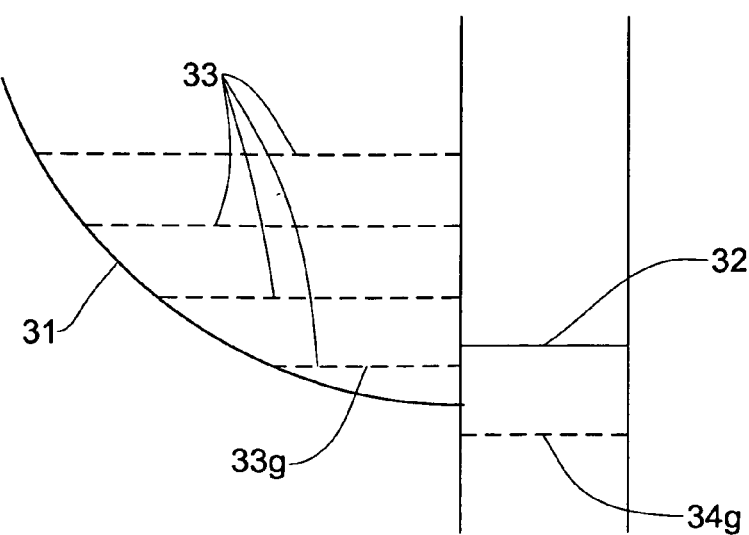
FIG. 2 exemplifies the spatially inhomogeneous potential profile suitable to be used in the heterostructure of FIG. 1A.

Referring to FIG. 2, an example of the spatially inhomogeneous potential profile is illustrated for the heterostructure shown in FIG. 1A. According to this example, the potential profile 31 of the EQW corresponding to the first layer (12 in FIG. 1A) is substantially semi-parabolic, while the potential profile 32 of the HQW corresponding to the second layer (13 in FIG. 1A) is substantially step-like.

For example, in the case when the first and the second layers are fabricated from $X_sInAs_{1-s}$ and GaSb, respectively, the parameters of the first and second layers providing the quantum well profiles are as follows: the thickness of each of the first and the second layers is of about 1-500 nm; and the spatially inhomogeneity can be described by the approximation function $s=(x/x(0))^2$, where $x(0)$ can be in the region of 50-1000 nm, x is the concentration of component X, which may, for example, be one of the following: $X=GaAs_{\{0.09\}}Sb_{\{0.91\}}$; $X=InSb_{\{0.31\}}P_{\{0.69\}}$; $X=AlSb$.

The profile of the quantum wells EQW and HQW shown in FIG. 2 can result in the fact that a plurality of neighboring energy subbands 33 in the quantum well of the first layer 12 is substantially equidistant, thereby causing a resonance condition of the radiative transitions of non-equilibrium carriers between the neighboring energy subbands of the EQW.

Likewise, by controlling the above-described parameters of the second layer 13, the condition can be achieved when the distance between a ground subband 33g of the EQW and a ground subband 34g of the HQW is equal to the distance between the neighboring energy subbands 33 of the EQW.

The THz radiation obtainable by the technique of the present invention can thus be enhanced by creating a resonance condition of the radiative transitions between neighboring energy subbands within either one or both quantum wells EQW and HQW, and can be even more enhanced by the radiative transitions between the ground subband of the EQW and the ground subband of the HQW.

It should be appreciated that the situation can be also vice versa to that shown in FIG. 2, i.e. the quantum well corresponding to the second layer 13 can be substantially semi-parabolic, while the quantum well corresponding to the first layer 12 can be substantially step-like. Likewise, the quantum wells corresponding to the first and second layers can, inter alia, be both step-like or semi-parabolic.

Figure 3:
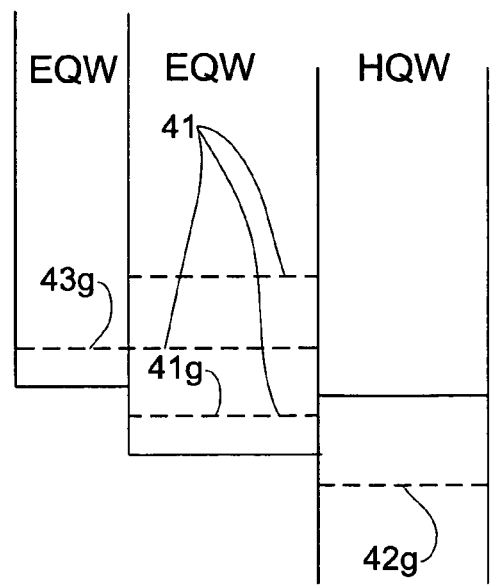
FIG. 3 illustrates an example of the potential profile suitable to be used in the heterostructure shown in FIG. 1C.

Referring to FIG. 3, an example of the potential profile of the heterostructure shown in FIG. 1C is illustrated. According to this example, the potential profiles of the EQW and HQW of the first and second layers 12 and 13, as well as an electron quantum well of the first cladding layer 17, are all substantially step-like. The parameters of the layers are selected so that a plurality of the neighboring energy subbands 41 in the EQW is substantially equidistant, thereby causing a resonance condition of the radiative transitions between the subbands. Moreover, the distance between the ground subband 41g of the EQW of the first layer 12 and the ground subband 42g of the HQW of the second layer 13 is equal to the distance between the ground subband 41g of the EQW and ground subband 43g of the EQW of the first cladding layer that, in turn, has the same energy as the ground subband 41g. According to this example, radiative transitions of non-equilibrium carriers can occur between: (i) the neighboring energy subbands 41 in the EQW; (ii) the ground subbands 41g and 43g; and (iii) the ground subbands 41g and 42g.

Figure 4:
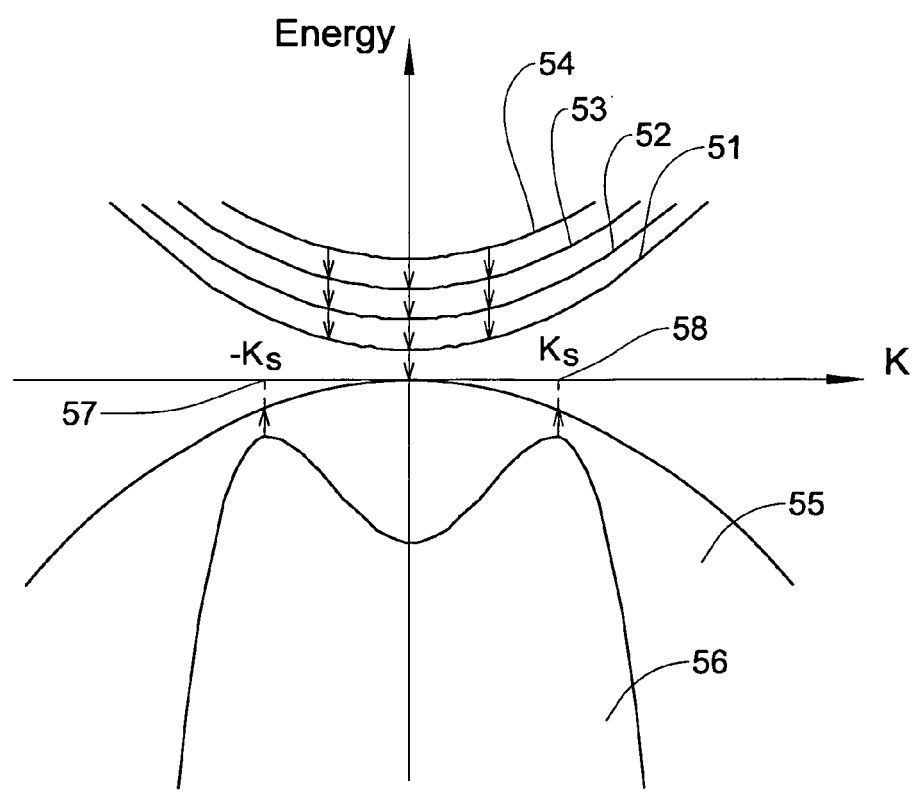
FIGS. 4 and 5 illustrate two examples, respectively, of a Wave vector-Energy plot for the subband dispersion of the heterostructure of the invention.

Referring to FIG. 4, an example of a Wave vector-Energy plot for the subband dispersion is illustrated for the heterostructure of the invention. According to this example, the parameters of the heterostructure are selected such that the ground subbands of the quantum wells in first and second layers 12 and 13 do not overlap (i.e., "negative" overlap).

On the one hand, subbands 51-54 corresponding to the EQW are all substantially parabolic and parallel in the Wave vector-Energy plot (k-E). On the other hand, a ground subband 55 corresponding to the HQW is an upside-down parabola, and a further subband 56 corresponding to the HQW has an upside-down W-like shape.

It should be appreciated that in the heterostructure having the subband dispersion as shown in FIG. 4 the following radiative transitions can occur.

A first type of transition can be achieved between the parallel subbands 51-54 within the entire range of variation of the wave-vector k. The inventor has found that for N parallel subbands, the gain provided by the resonance condition owing to the transition between the neighboring subbands can be approximately N times higher that in a conventional radiative system based on one radiative transition.

A second type of transition can be achieved between the ground subband 51 of the EQW and the ground subband 55 corresponding to the HQW when the wave-vector equals zero (i.e., k=0).

A third type of transition can be achieved between the ground subband 55 and the subband 56 both corresponding to the HQW. This transition can occur at a certain magnitude $k_s$ of the wave-vector indicated by reference numerals 57 and 58. As can be seen in FIG. 4, when the wave-vector equals $k_s$ the energy corresponding to the subband 56 is in the vicinity of its maximum value, thereby minimizing the energy gap between the ground subband 55 and the subband 56.

It should be appreciated that that the maximum gain can be obtained when all the three types of transition occur simultaneously.

Figure 5:
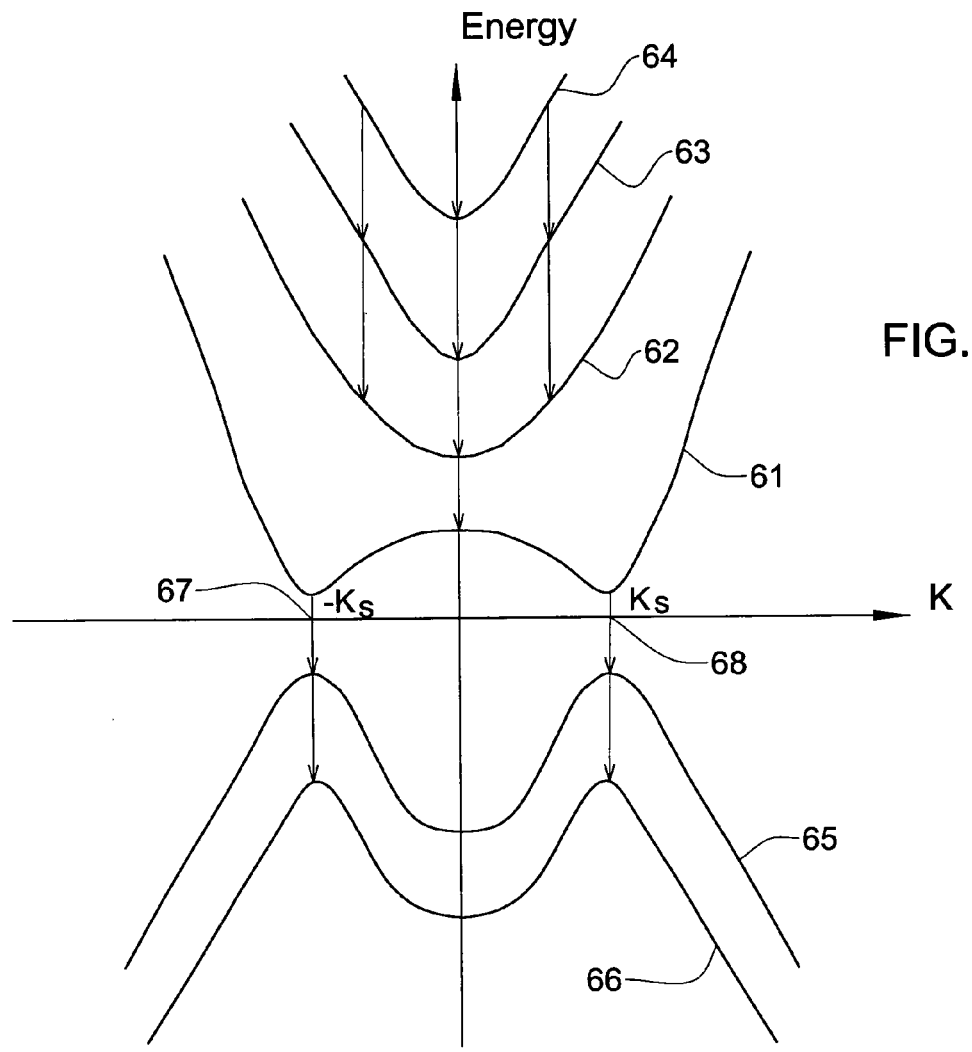

Referring to FIG. 5, another example of a Wave vector-Energy plot for the subband dispersion is illustrated for the heterostructure of the invention. According to this example, the parameters of the heterostructure are selected such that the ground subbands of the quantum wells in first and second layers substantially overlap (i.e., "positive" overlap). Here, a ground subband 61 of the EQW has a W-like shape in the Wave vector-Energy plot (k-E), while the other subbands 62-64 corresponding to the EQW are all substantially parabolic and parallel. In turn, a ground subband 65 and a further subband 66 corresponding to the HQW are substantially parallel and have an upside-down W-like shape.

In the heterostructure having the subband dispersion as shown in FIG. 5 the following radiative transitions can occur.

A first type of transition can be achieved between the parallel subbands 62-64 within the entire range of variation of the wave-vector k. Similar to the example of FIG. 4, for N parallel subbands, the gain provided by the resonance condition owing to the transition between the neighboring subbands can be approximately N times higher that in a conventional radiative system based on one radiative transition.

A second type of transition can be achieved between the ground subband 61 and subband 62 of the EQW when the wave-vector equals zero (i.e., k=0).

A third type of transition can be achieved between the ground subband 61 of the EQW and the ground subband 65 corresponding to the HQW. This transition can occur at the certain magnitude $k_s$ of the in plane wave-vector indicated by reference numerals 67 and 68. As can be seen in FIG. 5, when the wave-vector equals $k_s$ the energy gap between the ground subband 65 and the subband 66 is minimal. The inventors have found that this type of transition can be very useful for generating radiation of longer wavelengths of the THz range, e.g. for generating radiation of wavelengths longer than 100 microns and particularly longer than 150 microns. Though this type of transition can be successfully used for generating radiation of shorter wavelengths of the THz range as well.

A fourth type of transition can be achieved between the ground subband 65 and the subband 66 both corresponding to the HQW. This transition can occur at the certain magnitude $k_s$ of the in plane wave-vector.

It should be appreciated that that the maximum gain can be obtained when all the four types of transition occur simultaneously.

Figure 6:
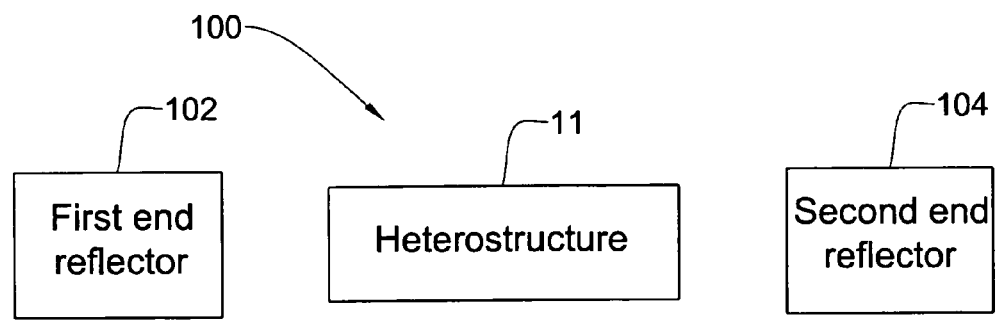
FIG. 6 exemplifies a semiconductor device of the invention configured as a resonator cavity (laser)

Reference is now made to FIG. 6, illustrating a resonator cavity (laser) 100 utilizing the device 10 of the present invention (constructed according to either one of the above examples). The device 10 is typically accommodated between end reflectors 102 and 104. The heterostructure 11 operates as an active medium of the resonator cavity.

Thus, the present invention provides a novel heterostructure for THz generation, which is formed by at least first and second semiconductor layers made of materials providing a quantum mechanical coupling between an electron quantum well (EQW) in the first layer and a hole quantum well (HQW) in the second layer with an overlap between the valence band of the second layer and the conduction band of the first layer. The layout of the heterostructure layers is selected so as to provide a predetermined dispersion of energy subbands in the conduction band of the first layer and in the valence band of the second layer to define a desired effective overlap between the energy subbands of these conduction and valence bands. Applying an external bias field across the first and second layers results in the THz spectral range radiation originating from radiative transitions of non-equilibrium carriers between ground energy subbands of the EQW and HQW (interband transitions) and/or neighboring energy subbands of the EQW and/or neighboring energy subbands of the HQW (intersubbands transitions).

Preferably, the heterostructure is based on coupled quantum wells of InAs—GaSb. This structure uniquely combines the advantages of both the p-n junction laser and the cascade laser.

The inventors have found that interband matrix elements are much larger than the intersubband one and also it is much easier to maintain population inversion for interband lasing. Interband radiative transitions can be realized in both V-shape carrier spectra (when the quantum confinement is so strong that it removes the band overlap completely, i.e., when the quantum wells are very narrow) and W-shape carrier spectra (when the quantum confinement does not remove this band overlap, and tunneling of carriers between InAs and GaSb leads to the formation of a hybridization gap, i.e., when the quantum wells are wide enough). The spectra can be strongly anisotropic for very wide quantum wells, and nearly isotropic for the wells that are not that wide. As the resulting gain depends on the details of the spectrum, fine details of spectrum should preferably be taken into account when designing a THz-lasing structure.

Figure 7A:
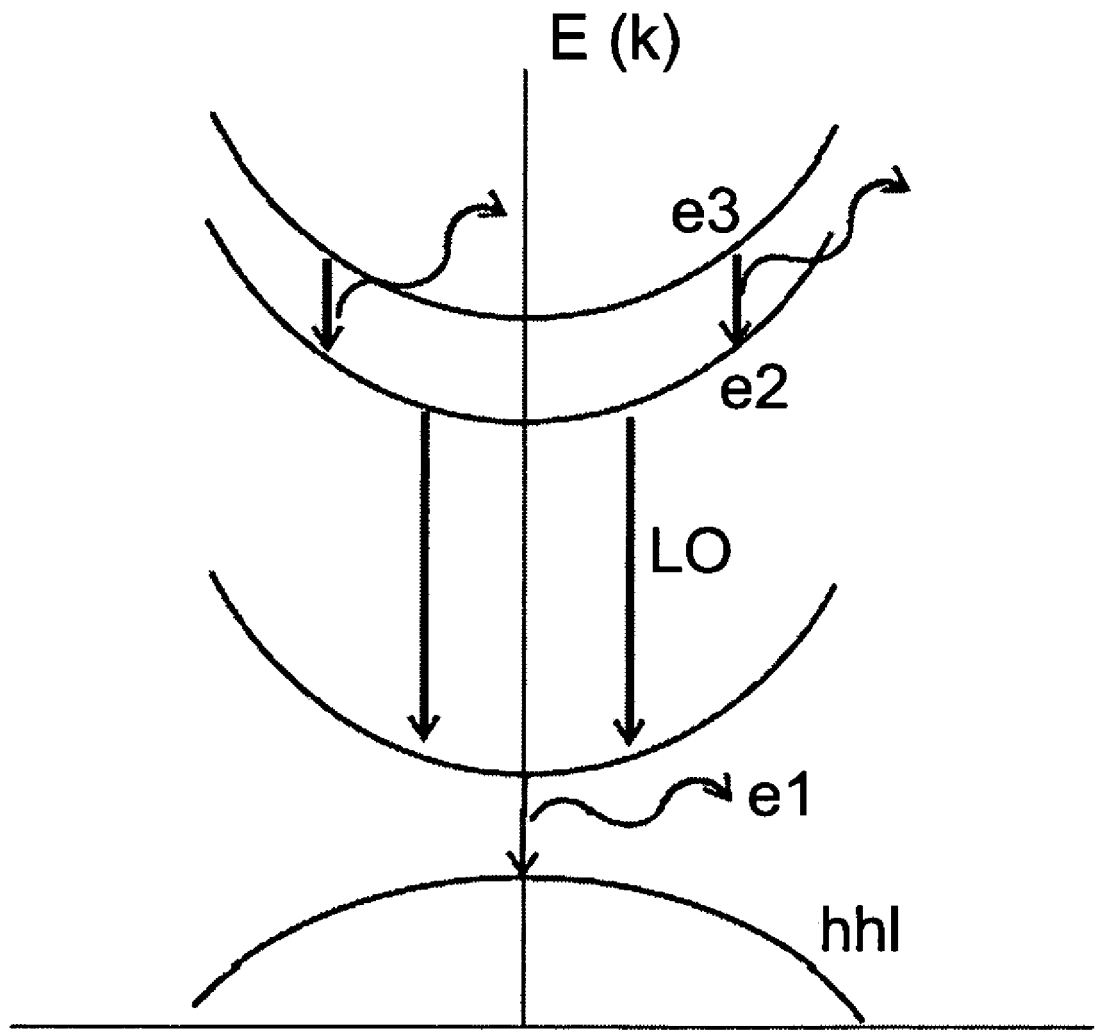
FIG. 7A illustrates the energy spectrum of narrow InAs/GaSb where the quantum size effect eliminates the band overlap (V-shape spectra)

Considering the case of very narrow quantum well, and thus nearly parabolic (V-shape) spectra, the resulting gap can be easily adjusted in the THz range by appropriate choice of the quantum well parameters. FIG. 7A exemplifies the energy spectrum of narrow InAs/GaSb structure where the quantum size effect eliminated the band overlap. A small energy separation between e2 and e3 levels is made by a step in the electron well. In this example, the width of the electron well is 27.4 nm while the width of the hole well is 1.8 nm.

FIG. 7A also illustrates a predetermined dispersion of heterostructure subbands in which there exists a couple (e3 and e2) of excited electron subbands of EQW coupled by a radiative THz transition and the lowest subband (i.e. subband e2) of this couple is separated from the ground electron subband of EQW by an energy distance being substantially equal to a phonon energy, e.g. longitudinal optical (LO) phonon energy. This ground electron subband is in its turn separated from the ground hole subband of HQW by an energy distance being also in a THz range and being preferably substantially equal to the energy separation between subbands e3 and e2. A transition from the ground electron subband of the EQW to the ground hole subband of the HQW can be radiative. Thus, in a preferred embodiment the THz radiation is producible by two radiative transitions: the transition between a couple of the excited energy subbands of the EQW, which is followed by a non-radiative LO-phonon assisted electron transition to the ground electron subband of the EQW, and the transition between the ground subbands of the EQW and the HQW. In a preferred embodiment, these two radiative transitions are of substantially the same frequency. Accordingly, these two radiative transitions can be (mutually) resonant.

Figure 7B:
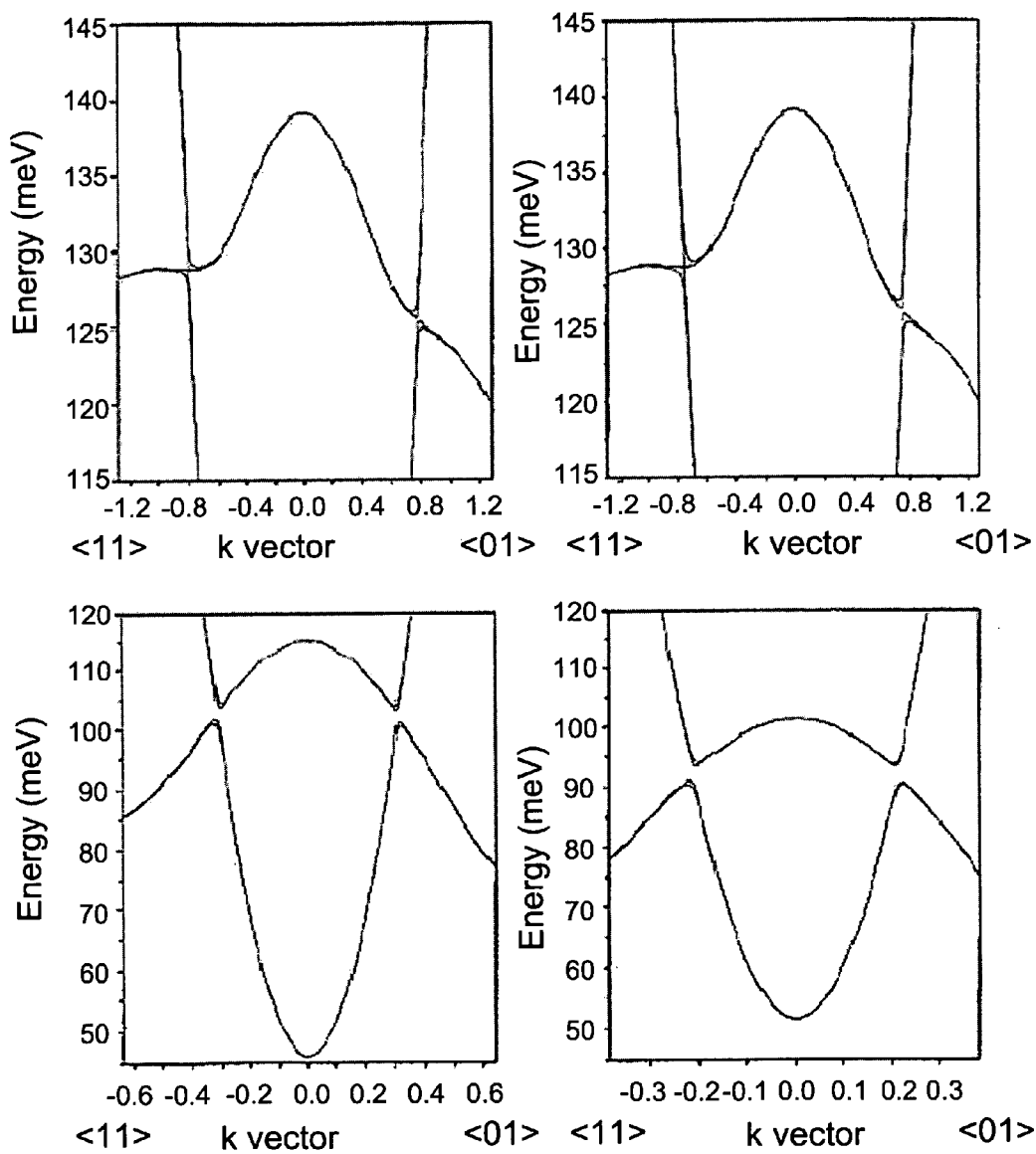
FIG. 7B exemplifies various W-shaped spectra of InAs/GaSb coupled quantum wells.

It should be noted, that in other embodiments more than one couple of excited electron subbands can be coupled by a radiative THz transition. Also, the device can be configured to utilize transitions between excited hole subbands in addition to or instead of transitions between excited electron subbands. The excited subbands coupled by a radiative THz transition are not necessarily neighbouring subbands. The ground energy subbands can be of W-shape or of nearly parabolic shape. In this case the energy distance separating the W-shaped ground subbands may correspond to a non-zero magnitude of the subband wave vector in the electron and hole ground subbands. Also, in a heterostructure including several electron and hole quantum wells the transition between the ground electron and hole subbands may involve a tunneling of a carrier to a quantum well different from the closest. FIG. 7B shows examples of W-shape spectra. Here, the energy spectrum of InAs/GaSb coupled quantum wells was calculated with the help of 4×4 Kohn-Luttinger Hamiltonian for GaSb. The valence band anisotropy is incorporated. For relatively wide GaSb well, the anisotropy leads to the absence of the density of states gap (a, b); for narrow GaSb wells (c, d) the density of states gap is nearly equal to the optical gap. The W-shape dispersion takes place when the width of the InAs well $L_e$ and the width of the GaSb well $L_h$ meet the condition $(38.5/L_e^2)+(4/L_h^2)<0,4$, where the lengths are in nanometers and the inequality has to be strong enough. The hybridization gap separating the W-shaped electron spectrum from the inverted W-shaped hole spectrum can be controlled by a thin AlSb barrier in between InAs and GaSb wells. According to theoretical estimates and experimental results, this gap varies in the region of a few meV, i.e., in the THz region.

Figure 7C:
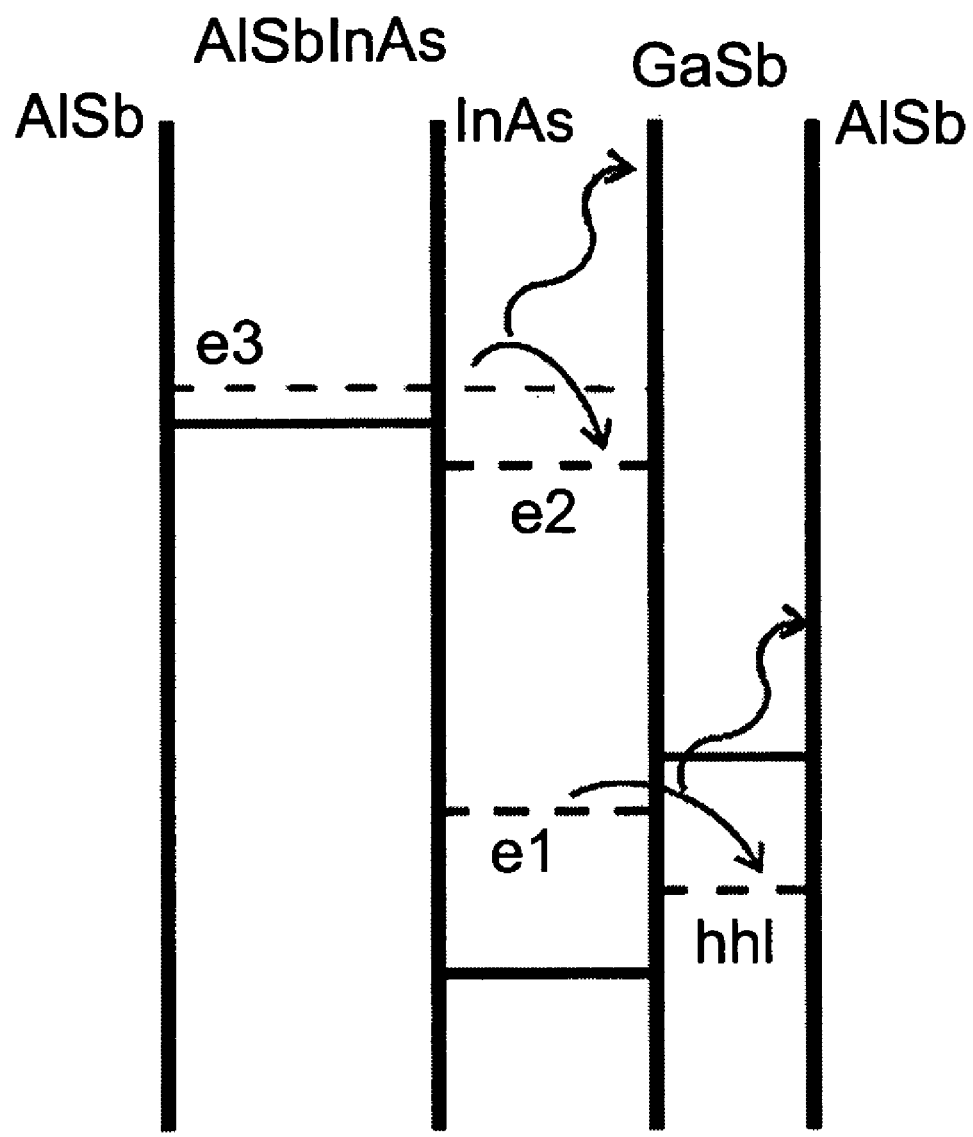
FIG. 7C exemplifies coupled quantum wells with step-like electron quantum well.

Relative smallness the THz energy makes it possible to increase the gain obtained from the e1-hh1 transition adding to it a resonant intersubband radiative transition, i.e., by creation cascade in k-space, as described above. The additional radiative transition takes place between e3 and e2 levels in the InAs well. To achieve the population inversion between these levels the energy separation between e2 and e1 is made equal to the optical phonon energy. A small THz energy separation between e2 and e3 is made a step-like design of the InAs well. This is illustrated in FIG. 7C. The step can be fabricated by the addition of a small fraction of AlSb to InAs, so that the exact composite of the whole structure is:

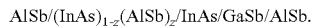

AlSb/(InAs)$_{1-z}$(AlSb)$_z$/InAs/GaSb/AlSb.

The separation between e1 and hh1 levels can be controlled not only by the widths of the wells but also by the composition, i.e., another possible structure is:

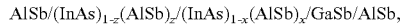

AlSb/(InAs)$_{1-z}$(AlSb)$_z$/(InAs)$_{1-x}$(AlSb)$_x$/GaSb/AlSb, where z>x.

The following Table presents the parameters of the structures with composition AlSb/(InAs)$_{0.98}$(AlSb)$_{0.02}$/InAs/GaSb/AlSb for lasing frequency 1 THz, 2 THz, and 3 THz. The energy step in the electron well for this composition is 41.4 meV. Here, ω is the radiation frequency, a is the width of the InAs well, b is the width of the (InAs)$_{0.98}$(AlSb)$_{0.02}$ step, $L_h$ is the width of the GaSb well, $E_{e1}$ and $E_{hh1}$ are the quantization energies of e1 and hh1 levels, $\Delta_{12}$ and $\Delta_{23}$ are the energy separations between e1-e1 and e2-e3 level.

| ω (THz) | a (nm) | b (nm) | $L_h$ (nm) | $E_{e1}$ (meV) | $\Delta_{12}$ (meV) | $\Delta_{23}$ (meV) | $E_{hh1}$ (meV) |
|---|---|---|---|---|---|---|---|
| 1 | 26.0 | 66.6 | 1.94 | 12.59 | 29.88 | 4.10 | 141.5 |
| 2 | 27.1 | 44.5 | 1.88 | 11.82 | 29.97 | 8.31 | 146.5 |
| 3 | 27.4 | 34.9 | 1.84 | 11.63 | 30.04 | 12.40 | 150.8 |

Figure 7D:
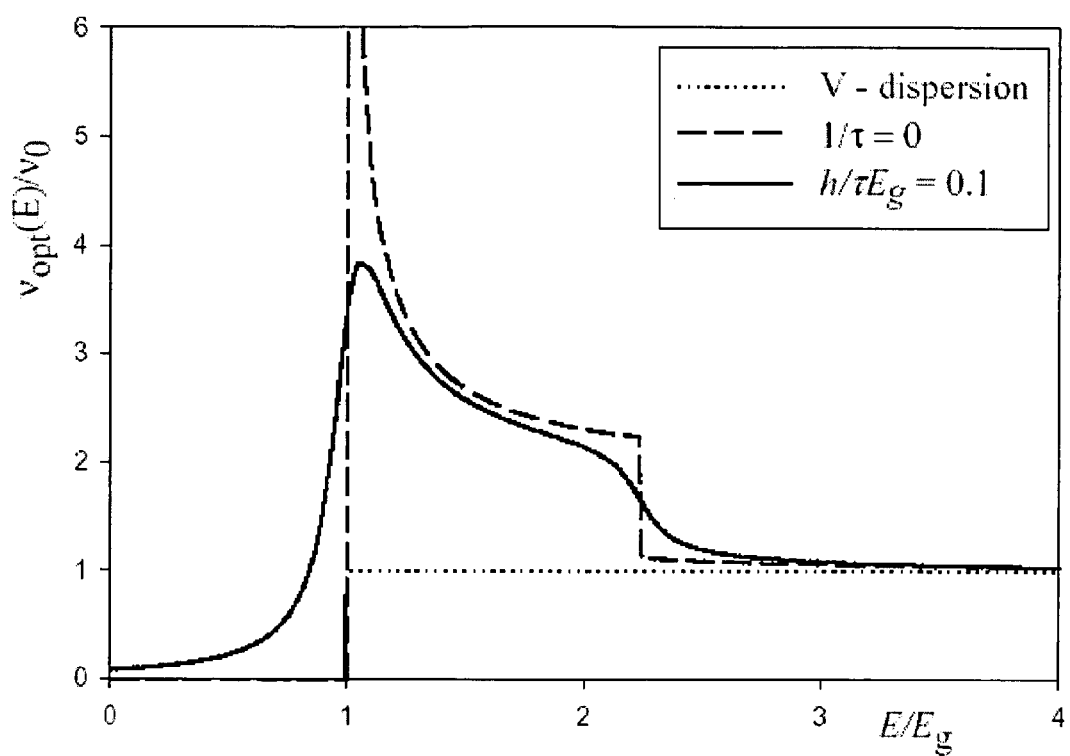
FIG. 7D illustrates the density of states for W-shape dispersion structure.

It should be noted that intersubband radiative transition and the radiative transition between electron and heavy hole levels are coupled with light of different polarization. Coherent emission of both transitions in our case is provided by rather strong light hole admixture to hh1 level. The possibility to create both interband and intersubband radiative transitions with the same frequency in the same cascade exists only for a small enough frequency due to limited band offset and band width. Hence, the k-cascade can be realized for structures lasing in the range from THz trough MIR. The structure design of W-shape spectrum (W-dispersion of the carriers in ground states) advantageously provides the singularity of the density of radiative states that leads to an enhancement of the radiative matrix element. FIG. 7D illustrates the density of states for W dispersion The value of relaxation time, τ, is also affected by the singularity of the density of states, and even for electron-electron scattering is τ≈1 ps. The density of states singularity does not affect the transition matrix element, so that in comparison with the V-dispersion, the probability of the photon emission increases by $\approx\sqrt{\omega\tau}$2.5 times for 1 THz.

The inventors have estimated ratio of gains for GaAs quantum well based laser structure and InAs—GaSb coupled quantum wells based structure. The following assumptions were made: both designs are based on a step-like well; in GaAs quantum well based laser structure the only radiative transition is intersubband, while in InAs—GaSb coupled quantum wells based structure the k-space cascade design was realized and light came out of both interband and intersubband transitions; both structures were designed to lase at 3 THz. The resulting ratio of the gains can reach about two orders of magnitude in favor of InAs—GaSb coupled quantum wells based structure. It should be noted that for the intersubband transitions, GaAs structure has a slightly larger gain because of different material constants, but the significant advantage of interband transitions leads to the huge integral benefit of InAs—GaSb. Hence, the advantages of interband optical transitions in coupled InAs/GaSb quantum wells can be used for design of THz lasing structures.

By appropriately designing InAs—GaSb coupled quantum wells based structure, the THz resonance between interband and intersubband transitions can be obtained. Thus, the k-space cascade can be used and a radiating electron may produce two THz photons instead of one. As indicated above, interband matrix elements are much larger than the intersubband one and also it is much easier to maintain population inversion for interband lasing. Interband radiative transitions can be realized in both V- and W-shape carrier spectra.

As such, those skilled in the art to which the present invention pertains, can appreciate that while the present invention has been described in terms of preferred embodiments, the concept upon which this disclosure is based may readily be utilized as a basis for the designing other structures, systems and processes for carrying out the several purposes of the present invention.

Also, it is to be understood that the phraseology and terminology employed herein are for the purpose of description and should not be regarded as limiting.

Finally, it should be noted that the term "comprising" as used throughout the appended claims is to be interpreted to mean "including but not limited to".

It is important, therefore, that the scope of the invention is not construed as being limited by the illustrative embodiments set forth herein. Other variations are possible within the scope of the present invention as defined in the appended claims and their equivalents.

The invention claimed is:

1. A method of fabricating a semiconductor device operable to generate a THz spectral range radiation in response to an external field, the method comprising forming a heterostructure from selected layers, wherein the layers include at least first and second semiconductor layers made of materials having a certain initial overlap between the valence band of the second layer material and the conduction band of the first layer material, the heterostructure layers being arranged with a selected layout providing a quantum mechanical coupling between an electron quantum well (EQW) in said first layer and a hole quantum well (HQW) in said second layer, the layout of the layers of the heterostructure is selected so as to define a predetermined arrangement of a plurality of energy subbands and a predetermined dispersion of these subbands to define a desired effective overlap between the energy subbands of said conduction and valence bands, thereby enabling the device operation for generation of the THz spectral range radiation originating from multiple radiative transitions of non-equilibrium carriers including at least one transition from transitions between the following: energy subbands of the EQW, energy subbands of the HQW, and ground energy electron subband of the EQW and ground energy hole subband of the HQW.

2. The method of claim 1, wherein said predetermined dispersion of the energy subbands includes W-like dispersion of both the ground hole subband of the HQW and of the ground electron subband of the EQW.

3. The method of claim 1, wherein said predetermined dispersion of the energy subbands includes parabolic-like dispersion of the ground hole subband of the HQW and of the ground electron subband of the EQW.

4. The method of claim 1, wherein said predetermined dispersion of the energy subbands is provided by selecting at least one of the following parameters of the layout: thickness of at least one of the layers, chemical compound of the material of at least one of the layers, width and predetermined potential profile of at least one of the quantum wells.

5. The method of claim 4, wherein the parameters selected to provide said predetermined dispersion of the energy subbands include the thickness and chemical compound of the material of a barrier layer arranged between the first and second layers.

6. The method of claim 4, wherein the parameters selected to provide said predetermined dispersion of the energy subbands include chemical compound of the material of cladding layers enclosing the first and second layers therebetween.

7. The method of claim 4, wherein a material composition of at least one of the first and second layers is selected to be spatially inhomogeneous in a direction normal to the respective layer, thereby providing for a predetermined inhomogeneous potential profile of the respective quantum well.

8. The method of claim 1, wherein the layer layout is selected so as to create a resonance condition of the multiple resonant radiative transitions substantially of the same frequency of the THz spectral range between the substantially equidistant neighboring subbands.

9. The method of claim 1, wherein said multiple radiative transitions include a transition between the ground subband of the EQW and the ground subband of the HQW.

10. The method of claim 1, wherein said multiple radiative transitions include transitions between a few of the energy subbands of a quantum well selected from the EQW and HQW.

11. The method of claim 1, wherein said multiple radiative transitions include a transition between energy subbands of a quantum well selected from the EQW and HQW and a transition between the ground electron energy subband of the EQW and the ground hole subband of the HQW.

12. The method of claim 7, wherein the predetermined inhomogeneous potential profile of at least one quantum well selected from the EQW and HQW is selected to be substantially semi-parabolic, thereby providing for substantial equidistance in between a few of neighboring energy subbands including neighboring energy subbands in this quantum well and the neighboring ground electron subband of the EQW and ground hole subband of the HQW for causing the multiple radiative transitions substantially of the same frequency of the THz spectral range between the substantially equidistant neighboring subbands.

13. The method of claim 7, wherein the predetermined potential profile of at least one quantum well selected from the EQW and HQW is selected to be substantially step-like, thereby providing for substantial equidistance in between a few of neighboring energy subbands including neighboring energy subbands in said quantum well and the neighboring ground electron subbands of the EQW and ground hole subband of the HQW for causing the multiple radiative transitions substantially of the same frequency of the THz spectral range between the substantially equidistant neighboring subbands.

14. The device of claim 1, wherein the predetermined potential profile of one of the EQW and HWQ is selected to be substantially semi-parabolic and the predetermined potential profile of the other of said EQW and HQW is step-like.

15. The method of claim 8, wherein said multiple resonant radiative transitions include a transition between neighboring subbands of the EQW within the entire range of variation of a wave-vector.

16. The method of claim 15, wherein said neighboring subbands of the EQW are parallel in a subband dispersion plot.

17. The method of claim 15, wherein the multiple radiative transitions include a radiative transition between the ground electron subband of the EQW and the ground hole subband of the HQW.

18. The method of claim 9, wherein said radiative transition between the ground electron subband of the EQW and the ground hole subband of the HQW is to occur either at a zero value of a wave-vector for parabolic-like dispersion of said ground subbands or at a non-zero value of an electron wave-vector for W-like dispersion of said ground subbands.

19. The method of claim 9, wherein the multiple radiative transitions include a radiative transition between the ground subband of the HQW and its neighboring subband in the HQW at a predetermined magnitude of the wave-vector, where an energy gap between the ground subband of the HQW and its neighboring subband in the HQW is minimal.

20. A method of fabricating a semiconductor device operable to generate a THz spectral range radiation in response to an external field, the method comprising forming a heterostructure from selected layers, wherein the layers include at least first and second semiconductor layers made of materials having a certain initial overlap between the valence band of the second layer material and the conduction band of the first layer material, the heterostructure layers being arranged with a selected layout providing a quantum mechanical coupling between an electron quantum well (EQW) in said first layer and a hole quantum well (HQW) in said second layer, the layout of the layers of the heterostructure is selected so as to define a predetermined arrangement of a plurality of energy subbands and a predetermined dispersion of these subbands to define a desired effective overlap between the energy subbands of said conduction and valence bands, the heterostructure is being provided with electrode contacts for application of a bias field across the first and second layers thereby enabling the device operation for generation of the THz spectral range radiation originating from multiple radiative transitions of non-equilibrium carriers including at least one transition from transitions between the following: neighboring energy subbands of the EQW, neighboring energy subbands of the HQW, and ground energy electron subband of the EQW and ground energy hole subband of the HQW.

21. The method of claim 1, wherein the first layer material is InAs-based and the second layer material is GaSb-based.

22. The method of claim 21, wherein the thickness of each of the first and second layers is in a range of about 1-500 nm.

23. The method of claim 1, wherein the first and second layers are directly coupled to each other with no additional layer between them.

24. The method of claim 1, wherein the heterostructure being formed comprises a barrier layer between the first and second layers.

25. The method of claim 24, wherein the barrier layer is based on AlSb.

26. The method of claim 24, wherein the barrier layer has a thickness in a range of about 0.6-6 nm.

27. The method of claim 1, wherein the heterostructure being formed comprises first and second cladding layers enclosing the first and second layers therebetween, respectively.

28. The method of claim 27, wherein the first and second cladding layers are selected from AlInAs-based and AlSb-based materials, respectively.

29. The method of claim 24, wherein the heterostructure being formed comprises first and second cladding layers enclosing therebetween the first and second layers with the barrier layer between the first and second layers.

30. The method of claim 1, comprising forming an electrode arrangement configured to provide electrical contacts to the first and second layers and thereby enabling the application of external bias field.

31. The method of claim 1, comprising forming reflectors at opposite sides of the heterostructure, thereby configuring the device as a resonator cavity, said heterostructure serving as an active medium of the cavity.

32. The method of claim 1, wherein said selected layout of the layers of the heterostructure defines a predetermined energy gap of the THz spectral range between the ground energy subband of the EQW and the ground energy subband of the HQW.

33. The method of claim 1, wherein said THz spectral range includes a spectral range from 0.1 through 20 THz.

34. The method of claim 1, wherein a frequency of said at least one transition is lower than a frequency of optical phonons.

35. A method of fabricating a semiconductor device operable to generate a THz spectral range radiation in response to an external field, the method comprising forming a heterostructure from selected layers, wherein the layers include at least first and second semiconductor layers made of materials having a certain initial overlap between the valence band of the second layer material and the conduction band of the first layer material, the heterostructure layers being arranged with a selected layout providing a quantum mechanical coupling between an electron quantum well (EQW) in said first layer and a hole quantum well (HQW) in said second layer and providing a predetermined potential profile in at least one of the quantum wells, defining an arrangement of a ground electron energy subband in the EQW and a hole energy subband in the HQW, thereby defining a desired effective overlap between the energy subbands of said conduction and valence bands thereby enabling the device operation for generation of the THz spectral range to originate from a radiative transition of non-equilibrium carriers between said ground subbands.

36. A method of claim 35, wherein said radiative transition between the ground electron subband of the EQW and the ground hole subband of the HQW is to occur either at a zero value of a wave-vector for parabolic-like dispersion of said ground subbands or at a non-zero value of a wave-vector for W-like dispersion of said ground subbands.

37. A method of claim 1, wherein the predetermined dispersion of the subbands is such that there exists at least one couple of excited electron subbands of the EQW coupled by a first radiative THz transition, the lower subband of said couple being separated from the ground electron subband of the EQW by a first energy distance substantially equal to a phonon energy, said ground electron subband being coupled with the ground hole subband of the HQW by a second THz transition.

38. A method of claim 37, wherein said phonon energy is energy corresponding to a longitudinal optical phonon.

39. A method of claim 37, wherein the first and second THz transitions are of substantially the same frequencies.

40. A method of claim 37, wherein the predetermined dispersion of the ground energy subbands is substantially W-shaped.

41. A method of claim 37, wherein the predetermined dispersion of the ground energy subbands is nearly parabolic.

* * * * *